United States Patent
Takimoto

(10) Patent No.: US 6,946,409 B2
(45) Date of Patent: Sep. 20, 2005

(54) METHOD OF MANUFACTURING SEMICONDUCTOR DEVICE HAVING NITRIDE FILM WITH IMPROVED INSULATING PROPERTIES

(75) Inventor: Toshihide Takimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/843,560

(22) Filed: May 12, 2004

(65) Prior Publication Data

US 2004/0235314 A1 Nov. 25, 2004

(30) Foreign Application Priority Data

May 21, 2003 (JP) .................................. 2003-143225

(51) Int. Cl.[7] .................... H01L 21/31; H01L 21/469
(52) U.S. Cl. ................... 438/791; 438/680; 438/905
(58) Field of Search .......................... 438/791, 680, 438/692, 238, 381, 423, 935, 709, 778, 905

(56) References Cited

U.S. PATENT DOCUMENTS

| | | | | |
|---|---|---|---|---|
| 5,015,353 A | * | 5/1991 | Hubler et al. | 427/527 |
| 5,939,333 A | * | 8/1999 | Hurley et al. | 438/791 |
| 6,204,206 B1 | * | 3/2001 | Hurley | 438/791 |
| 6,268,299 B1 | * | 7/2001 | Jammy et al. | 438/791 |

FOREIGN PATENT DOCUMENTS

JP 2002-343793 11/2002

* cited by examiner

*Primary Examiner*—David Nhu
(74) *Attorney, Agent, or Firm*—McGinn & Gibb, PLLC

(57) ABSTRACT

A method of manufacturing a semiconductor device according to the present invention involves forming two layers of silicon nitride films as an insulating film by reacting a nitrogen containing gas with dichlorosilane to form one silicon nitrogen film, and reacting the nitrogen containing gas with a compound composed of silicon and chlorine to form the other silicon nitride film. One silicon nitride film excels in the leak current characteristic, while the other silicon nitride film is deposited faster than the one silicon nitride film, resulting in improved insulating properties of the silicon nitride films as well as a higher throughput in the formation of the simulating film.

17 Claims, 11 Drawing Sheets

METHOD OF MANUFACTURING SEMICONDUCTOR DEVICE HAVING NITRIDE FILM WITH IMPROVED INSULATING PROPERTIES

BACKGROUND OF THE INVENTION

1. Field of the Invention

The present invention relates to a method of manufacturing a semiconductor device having an insulating film.

2. Description of the Related Art

Conventionally, semiconductor devices represented by memories such as DRAM (Dynamic Random Access Memory) and static-RAM, and logics are formed with semiconductor elements such as resistors, capacitors and the like. In the following, a semiconductor device will be described in connection with the configuration of DRAM.

FIG. 1 is a cross-sectional view illustrating an exemplary configuration of DRAM.

As illustrated in FIG. 1, the DRAM comprises memory cell region 80 in which memory cells are formed for storing information, and peripheral circuit region 90 in which a circuit is formed for selecting an arbitrary memory cell.

Each of memory cells formed in memory cell region 80 comprises cell transistor 106 and capacitor 112. Cell transistor 106 has P-well layer 103 formed within P-type silicon substrate 101 near the surface thereof; gate electrode 111a formed on P-well layer 103 through gate insulating film 110; and drain electrode 108 and source electrode 109 formed in P-well layer 103. Capacitor 112 has upper electrode 126 which serves as a plate electrode; lower electrode 124 which serves as a storage electrode; and dielectric material 125 sandwiched between upper electrode 126 and lower electrode 124.

Source electrode 109 of cell transistor 106 is connected to lower electrode 124 of capacitor 112 through silicon plug 114a, 114b made of polysilicon into which impurities are diffused to reduce the resistance. Drain electrode 108, which is shared by cell transistor 106 and cell transistor 107, is connected to bit line 117 through silicon plug 114e. Cell transistors 106, 107, which share drain electrode 108, are electrically insulated by isolation region 105 from other cell transistors. Gate electrode 111a is reduced to gate electrode interconnection 111b which serves as an interconnection on isolation region 105.

Interlayer insulating film 113 and interlayer insulating film 121 are formed between gate electrode 111a and bit line 117, while interlayer insulating film 123 is formed between bit line 117 and capacitor 112. Upper electrode 126 of capacitor 112 has a top surface covered with interlayer insulating film 130 which is formed on interlayer insulating film 123 through interlayer insulating film 127. These interlayer insulating films ensure the insulation between respective elements for preventing elements from conducting with each other except for a desired connection.

As illustrated in FIG. 1, peripheral circuit transistor 150 is formed on P-well layer 104 within P-type silicon substrate 101 in peripheral circuit region 90. Peripheral circuit transistor 150 has a source electrode and a drain electrode connected to interconnection 152 which is formed in the same layer as bit line 117 in memory cell region 80 through tungsten plug 118 which is comprised of a laminated tungsten nitride (WN) film and tungsten (W) film. Interconnection 152 is connected to interconnection 156 formed on interlayer insulating film 130 through via plug 154 which is comprised of a laminated titanium nitride (TiN) film and W film.

In the DRAM configured as described above, a predetermined cell transistor can be turned on to write or read information into or from the cell transistor by arbitrarily selecting a bit line and a gate line through the operation of the peripheral circuit, and applying voltages to the selected bit line and gate line.

FIG. 2 is a cross-sectional view illustrating a main portion of the memory cell illustrated in FIG. 1, when viewed from a different direction.

As illustrated in FIG. 2, bit lines 117a, 117b are comprised of laminated conductive WN film 119 and W film 120. Lower electrode 124 of capacitor 112 is connected to source electrode 109 through silicon plugs 114c, 114d. For electrically insulating these two bit lines 117a, 117b from silicon plug 114c, mask nitride film 158 made of a silicon nitride film (hereinafter simply called the "nitride film") is formed on bit lines 117a, 117b, and spacer nitride film 160 is formed on side walls of bit lines 117a, 117b.

Conventionally, spacer nitride film 160 mentioned above has been formed of a nitride film which is deposited by reacting dichlorosilane $SiH_2Cl_2$ with ammonia ($NH_3$) at temperature of 760° C. in accordance with a CVD (Chemical Vapor Deposition) method. In the following description, dichlorosilane is designated by DCS.

For increasing the integration degree of semiconductor devices, it is necessary to further suppress diffusion of impurities within a semiconductor substrate. For suppressing the diffusion of impurities, the semiconductor substrate should undergo a reduced amount of heat treatment. For this reason, a single wafer system, which forms a nitride film on a semiconductor substrate one by one, has been prevalently used to form nitride films instead of a batch processing system which is capable of forming nitride films on a plurality of semiconductor substrates at a time, because the single wafer system applies a reduced amount of heat treatment to semiconductor substrates.

On the other hand, for reducing the amount of heat treatment in the batch processing system without using the single wafer system, there is a method for depositing a nitride film at lower temperatures. However, when a nitride film is deposited using DCS at a temperature reduced to as low as 600° C., the deposition rate becomes lower, resulting in a low throughput which represents the amount of processing per unit time.

To solve the problem of low throughput, in recent years, the deposition has been performed by a batch processing system using a reaction gas which consists of hexachlorodisilane $Si_2Cl_6$ that is capable of depositing a nitride film at temperatures lower than is capable with DCS. Such a method is disclosed in Japanese Patent Laid-open Publication No.343793/2002. In the following description, hexachlorodisilane is designated by HCD.

Nitride films were deposited using HCD under the following processing conditions: at temperature of 600° C., at a gas flow ratio $HCD/NH_3$ equal to 1:30, for a deposition time of approximately one hour. In the following description, a nitride film formed using DCS is designated by $DCS-Si_3N_4$, and a nitride film formed using HCD is designated by $HCD-Si_3N_4$.

From the fact that the deposition of $HCD-Si_3N_4$ at approximately 600° C. entails a deposition rate equivalent to that in deposition of $DCS-Si_3N_4$ at approximately 760° C., this deposition provides a higher throughput than deposition of $DCS-Si_3N_4$ at 600° C. Also, $HCD-Si_3N_4$ deposited by a batch processing system exhibits a better coverage to an underlying step, as compared with $DCS-Si_3N_4$ deposited by a single wafer system, and is formed in a uniform thickness independently of the density of an underlying pattern. It has thus been found that HCD-$Si_3N_4$ deposited by a batch processing system is superior to DCS-$Si_3N_4$ deposited by a single wafer system in regard to the step coverage and pattern density dependence.

In a screening test made for prototype DRAMs which included a spacer nitride film made of the aforementioned HCD-$Si_3N_4$, reliability failures were found. Presumably, the failures were caused by a leak current between the silicon plug and bit line shown in FIG. 2 which was larger than a leak current of DRAM which employed DCS-$Si_3N_4$ for a spacer nitride film. To address the reliability failures, the leak current characteristic was evaluated in the following manner.

TEG (Test Element Group) used for measuring a leak current has an insulating film, subjected to the measurement of the leak current, sandwiched between two flat conductors having a predetermined pattern thereon. The measurement was made under the condition that the leak current was defined as a current flowing through the insulating film when a voltage was applied across the conductors to generate an electric field of 4 [MV/cm] across the conductors.

It was found from the result of the measurement that HCD-$Si_3N_4$ exhibited a leak current of approximately 3E-4 [$A/cm^2$] which was larger by approximately three orders of magnitude than a leak current of approximately 2E-7 [$A/cm^2$] exhibited by DCS-$Si_3N_4$. When a large leak current flows from a lower electrode of a capacitor of a DRAM into a bit line through a silicon plug, the capacitor can store charges for a shorter time, so that the DRAM must be refreshed at shorter time intervals, resulting in larger power consumption of the DRAM.

Next, for evaluating DRAMs in a structure similar to actual products, a burn-in test was conducted for the structure illustrated in FIG. 2, wherein a high voltage was applied between the silicon plug and bit line at high temperatures to acceleratively apply a load on the insulating film. The result of the burn-in test will be described below.

FIG. 3 is a graph showing the convergence of percent defective resulting from the burn-in test made for DCS-$Si_3N_4$ and HCD-$Si_3N_4$. The horizontal axis represents the number of times of the burn-in test which took a duration λ each time, and the vertical axis represents the percent defective.

As shown in FIG. 3, DCS-$Si_3N_4$ required five tests before the percent defective was reduced to 200 fit, which was defined to be a product shipment reference, or less, whereas the percent defective associated with HCD-$Si_3N_4$ was higher than 200 fit and did not converge even after the test had been conducted seven times. From the foregoing result, a semiconductor device which employs a spacer nitride film made of a single layer of HCD-$Si_3N_4$ will entail an increased number of steps for screening, as compared with a semiconductor device which employs a spacer nitride film made of a single layer of DCS-$Si_3N_4$, thereby possibly increasing a period from the start of manufacturing to shipment of the semiconductor devices as well as the cost of the semiconductor devices.

SUMMARY OF THE INVENTION

It is an object of the present invention to provide a method of manufacturing a semiconductor device using an insulating film which is improved in insulating properties over the prior art by limiting the diffusion of impurities into a semiconductor substrate.

The method of manufacturing a semiconductor device according to the present invention forms two layers of silicon nitride films, which make up an insulating film, by reacting a nitrogen containing gas with dichlorosilane to form one silicon nitrogen film, and reacting the nitrogen containing gas with a compound composed of silicon and chlorine to form the other silicon nitride film.

In the present invention, one silicon nitride film excels in the leak current characteristic, while the other silicon nitride film is deposited faster than the one silicon nitride film. Consequently, the two layers of silicon nitride films are improved in the insulating properties, and the insulating film is formed at a higher throughput.

Another method of manufacturing a semiconductor device according to the present invention forms two layers of silicon nitride films, which make up an insulating film, by reacting a compound composed of silicon and chlorine with a nitrogen containing gas under the condition that a gas flow ratio of the compound to the nitrogen containing gas is smaller than 1/30 to form one silicon nitride film, and reacting the nitrogen containing gas with the compound under the condition that the gas flow ratio is higher than during the formation of the one silicon nitride film to form the other silicon nitride film of at least the two silicon nitride films.

In this method, the one silicon nitride film excels in the leak current characteristic, while the other silicon nitride film varies less in the thickness of the deposited film than the one silicon nitride film. Consequently, the two silicon nitride films are improved in the insulating properties, and the insulating film is improved in thickness uniformity. In this event, the gas flow ratio may be set to 1/100–1/150 to further reduce a leak current which flows into the silicon nitride films.

In addition, at least one of the silicon nitride films may be deposited at temperatures as low as 400–700° C. to reduce the amount of heat treatment applied to the semiconductor device.

Further, the one silicon nitride film may have a thickness lesser than the other silicon nitride film to reduce an overall deposition time for the formation of the silicon nitride films, thus increasing the throughput for the formation of the silicon nitride films.

Accordingly, the method of manufacturing a semiconductor device according to the present invention forms a laminate structure for an insulating film between conductors by depositing a first nitride film, which excels in the leak current characteristic, in a lesser thickness for the first layer, and then depositing a second nitride film, which can be deposited faster, for the second layer, without exposure to external air, so that the high throughput is maintained in the formation of the insulating film, and the resulting laminate structure reduces a leak current between conductors, as compared with before, to improve the insulating film in film quality. The second nitride film will not adversely affect the thickness uniformity of the insulating film if the deposited second nitride film varies little in thickness.

Also, when the semiconductor device is a DRAM in which a first nitride film and a second laminate film are laminated to form a laminate nitride film between a silicon plug connected to a capacitor and a bit line, a smaller leak current will flow from the capacitor into the bit line through the silicon plug. Thus, the resulting DRAM can store charges on the capacitor for a longer time, and can be refreshed at longer time intervals, resulting in a reduction in power consumption of the DRAM.

Further, the deposition of the first nitride film in a lesser thickness contributes to the throughput maintained equivalent to the prior art. In addition, when at least one of the first and second nitride films is deposited at lower temperature of 400–700° C., the semiconductor substrate is applied with a reduced amount of heat treatment. This can prevent the diffusion of impurities within the semiconductor substrate and increase the integration degree of the semiconductor device.

The above and other objects, features and advantages of the present invention will become apparent from the following description with reference to the accompanying drawings which illustrate examples of the present invention.

DETAILED DESCRIPTION OF THE PREFERRED EMBODIMENTS (First Embodiment)

Figure 4:
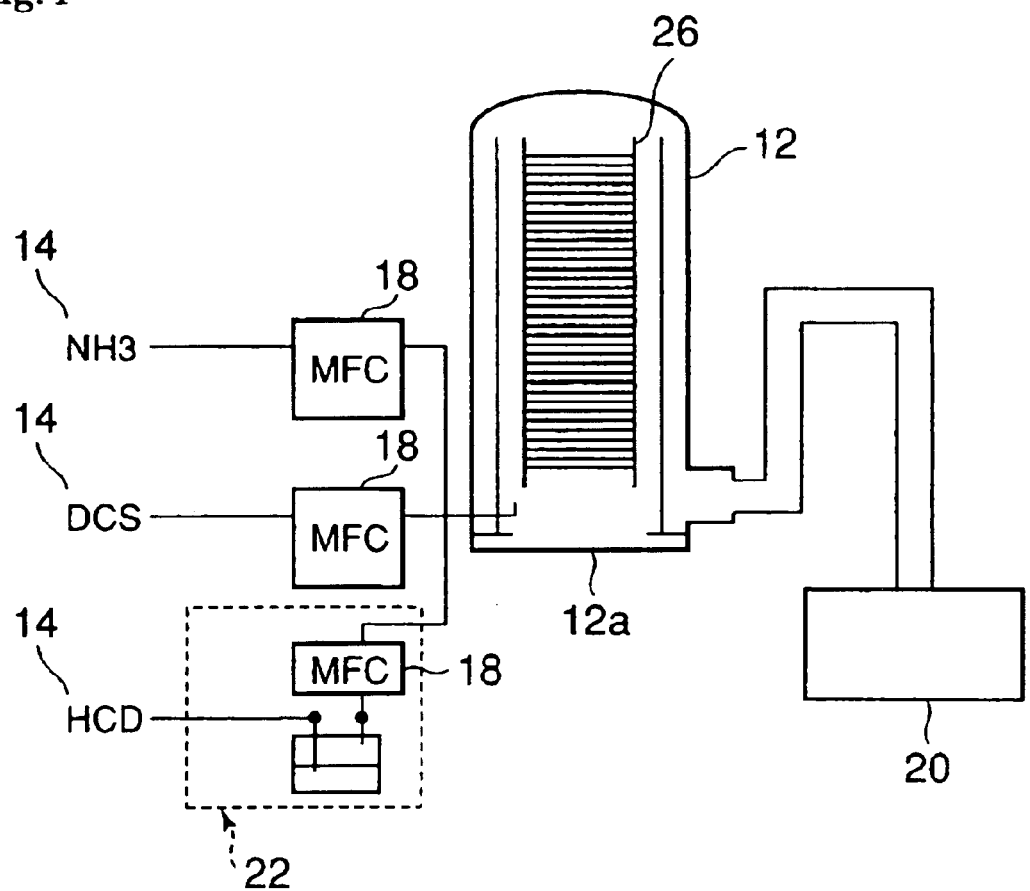
FIG. 4 is a block diagram illustrating an exemplary configuration of a vapor phase growth system for use in a method of manufacturing a semiconductor device according to the present invention.

First of all, description will be made on a vapor phase growth system for use in a method of manufacturing a semiconductor device according to the present invention. FIG. 4 is a block diagram illustrating an exemplary configuration of the vapor phase growth system. It should be noted that in the following description, semiconductor substrates include not only substrates made of silicon and the like, but also those which are formed thereon with semiconductor elements, interlayer insulating films, and the like.

The vapor phase growth system illustrated in FIG. 4 is a batch-type low pressure CVD system. The illustrated vapor phase growth system comprises processing furnace 12 for forming a nitride film on a semiconductor substrate; reaction gases 14 for forming the nitride film; gas conduits 16 for introducing reaction gases 14 into processing furnace 12; mass flow controllers (MFC) 18 each for controlling the flow rate of associated reaction gas 14; and exhaust pump 20 for exhausting gases in processing furnace 12. The vapor phase growth system also comprises a controller (not shown) for controlling the flow rates of various reaction gases, as well as the temperature and pressure within processing furnace 12. As illustrated in FIG. 4, baking unit 22 is installed in a pipe which introduces a HCD raw material into processing furnace 12 for heating the HCD.

Processing furnace 12 comprises lid 12a for isolating the interior of processing furnace 12 from external air; a heater for uniformly applying heat over processing furnace 12; a temperature sensor for monitoring the temperature within processing furnace 12; and a pressure sensor for monitoring the pressure within processing furnace 12. Near lid 12a of processing furnace 12, a transport robot is provided for carrying wafer board 26 into processing furnace 12 and removing wafer board 26 from processing furnace 12. This transport robot comprises a position sensor for monitoring the presence or absence of a cassette, the position of wafer board 26, and the like. Then, the transport robot carries unprocessed semiconductor substrates on wafer board 26 at a cassette yard, not shown, and returns processed semiconductor substrates from wafer board 26 to the cassette.

The controller comprises a CPU (Central Processing Unit) for executing predetermined processing in accordance with a program, and a memory for storing the program. The controller is connected to control signal lines for sending control signals to the heater, MFC 18, exhaust pump 20, and transport robot, and to monitor signal lines for receiving signals from a variety of sensors. The controller controls the respective components through the control signal lines and monitor signal lines, and executes processing in accordance with processing conditions previously registered by the operator to form a nitride film on each semiconductor substrate.

Next, description will be made on the structure of a semiconductor device manufactured by the manufacturing method of the present invention. In the following description, components similar to those in the prior art are designated the same reference numerals, and description thereon is omitted.

Figure 1:
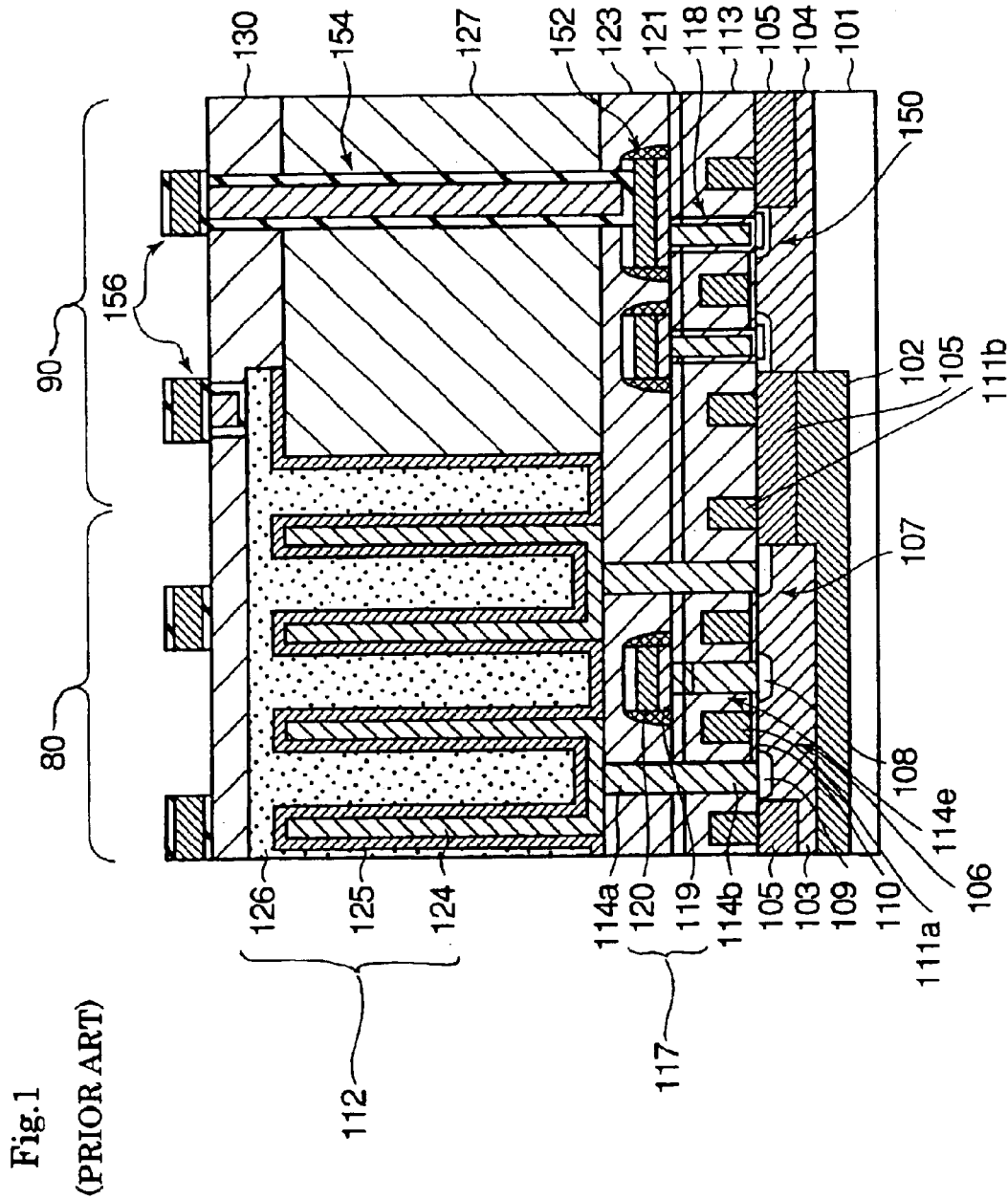
FIG. 1 is a cross-sectional view illustrating an exemplary configuration of a conventional semiconductor device.
Figure 2:
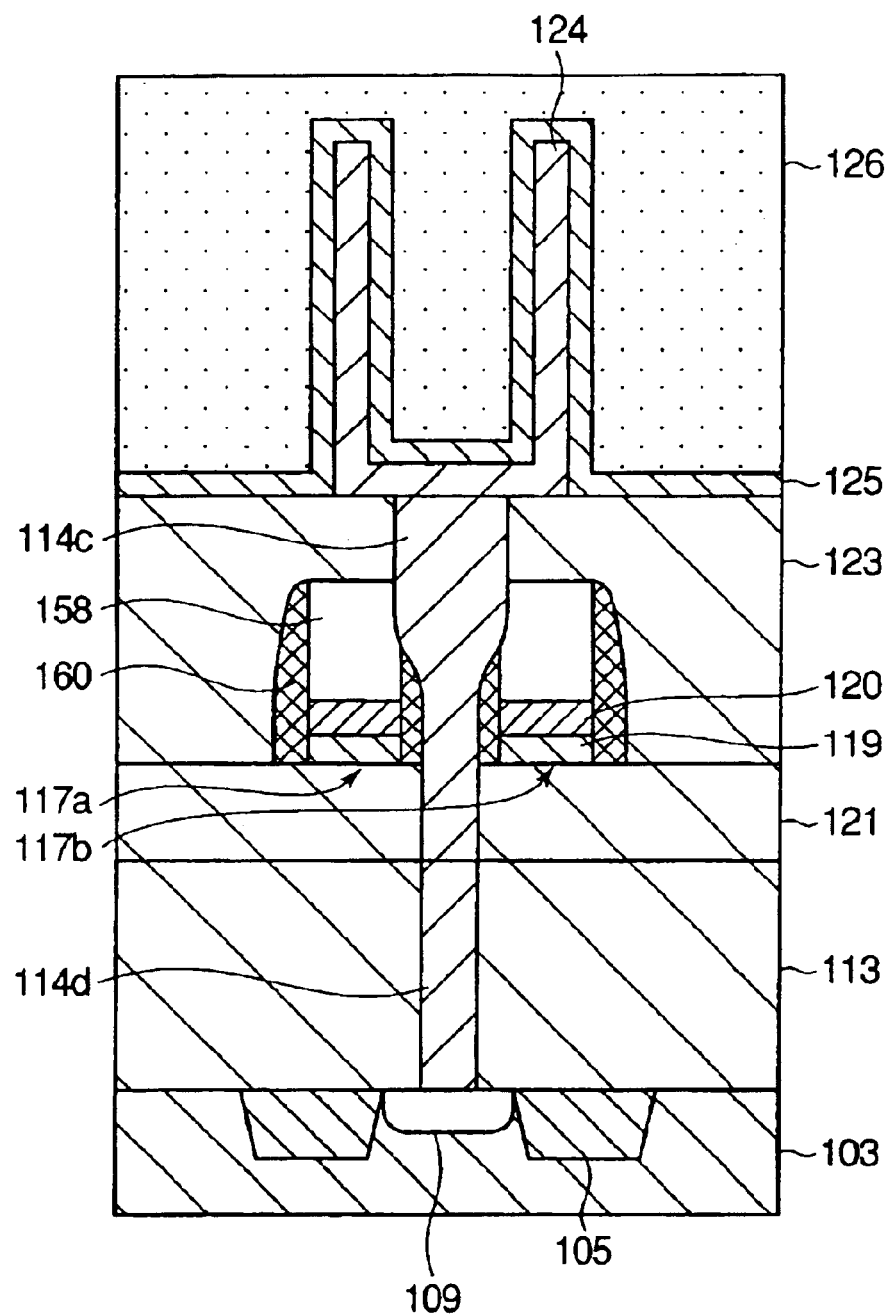
FIG. 2 is a cross-sectional view of a main portion of the semiconductor device illustrated in FIG. 1, when viewed from a different direction.
Figure 3:
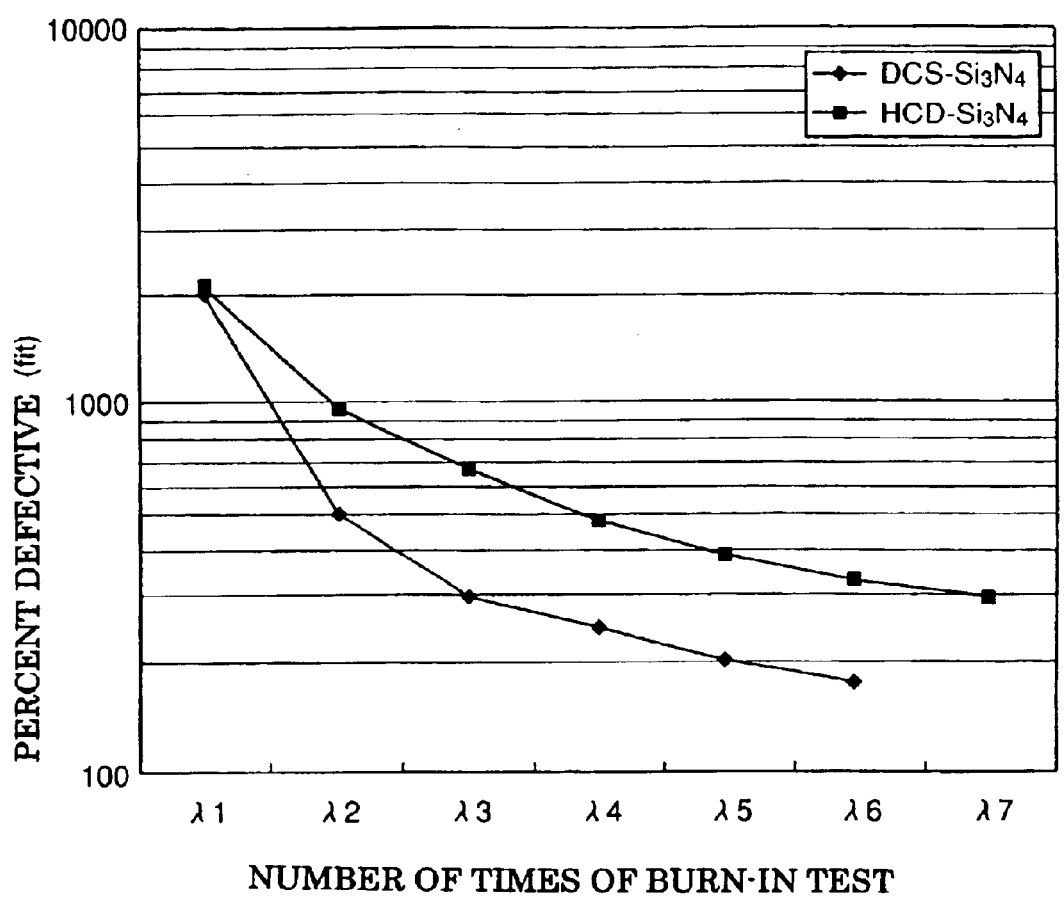
FIG. 3 is a graph showing the convergence of percent defective resulting from burn-in tests for evaluating the quality of nitride films.
Figure 5:
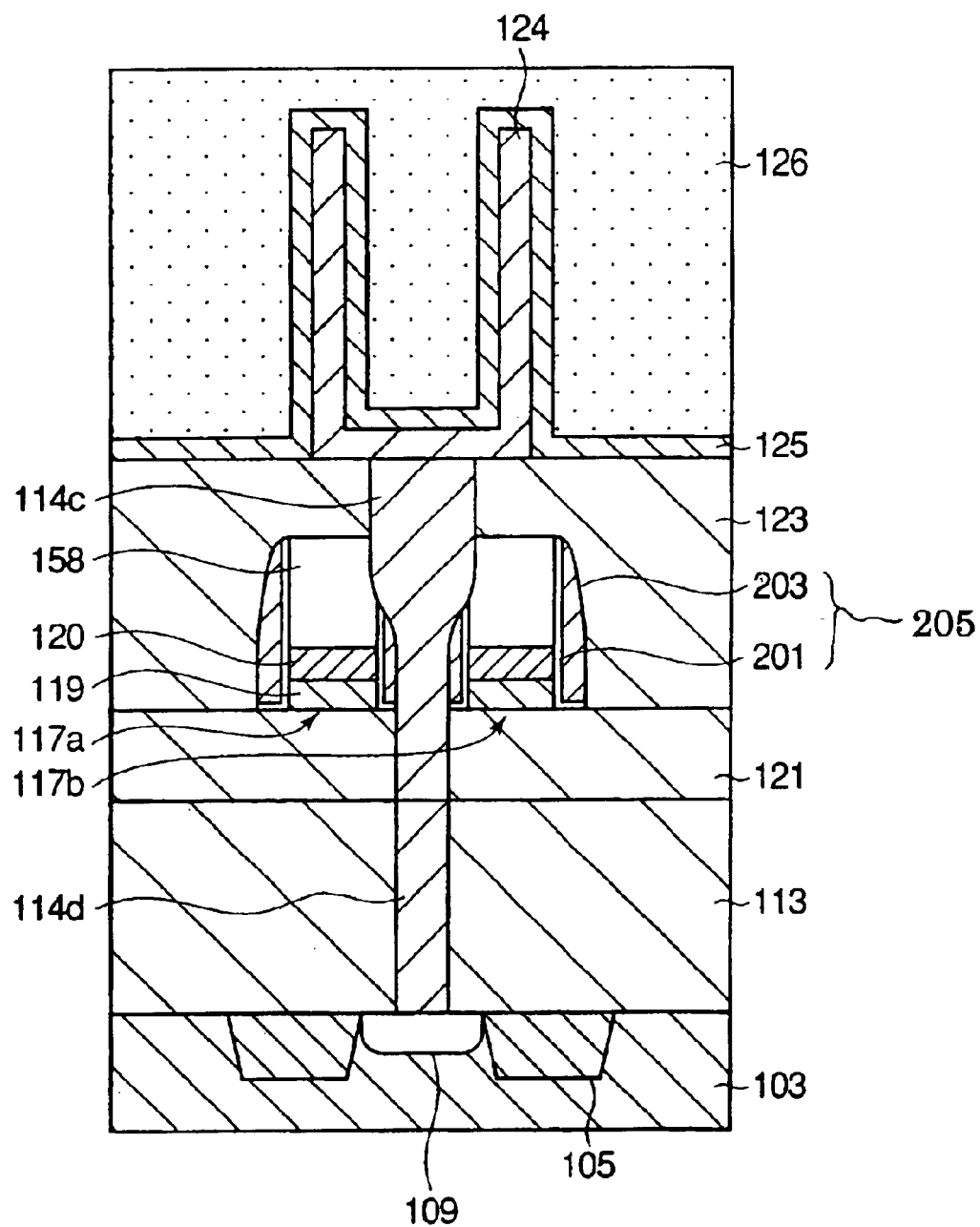
FIG. 5 is a cross-sectional view illustrating an exemplary structure of a semiconductor device according to the manufacturing method of the present invention.

FIG. 5 is a cross-sectional view illustrating an exemplary structure of a semiconductor device manufactured by the manufacturing method of the present invention. This figure illustrates the structure from P-well layer 103 to upper electrode 126 of a capacitor, with omission of the remaining structure because of its similarity to the structure illustrated in FIG. 1.

As illustrated in FIG. 5, spacer nitride film 205 is provided for electrically insulating bit lines 117a, 117b from silicon plug 114c. Spacer nitride film 205 is composed of nitride film 201 and nitride film 203. In this embodiment, nitride film 201 is made of DCS-Si$_3$N$_4$, while nitride film 203 is made of HCD-Si$_3$N$_4$.

Next, description will be made on a method of manufacturing the semiconductor device illustrated in FIG. 5. Since the structure underlying interlayer insulating film 121 illustrated in FIG. 5 is manufactured in a manner similar to before, the following description will be focused on the formation of interlayer insulating film 121 onward.

FIGS. 6A to 6H are cross-sectional views illustrating the method of manufacturing the semiconductor device according to the present invention.

Figure 6A:
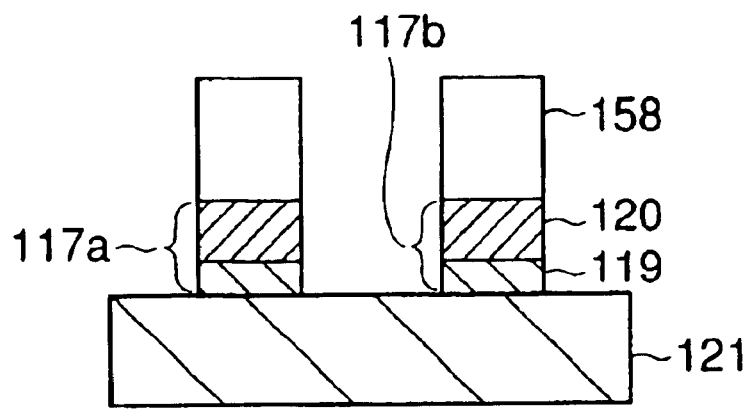
FIGS. 6A to 6H are cross-sectional views illustrating the method of manufacturing a semiconductor device according to the present invention.

As illustrated in FIG. 6A, WN film 119 and W film 120 are formed in order on interlayer insulating film 121 as conductive materials. Then, after mask nitride film 158 is formed by a plasma CVD method, bit lines 117a, 117b are formed by a known lithographic step and etching step. Resulting bit lines 117a, 117b have their top surfaces covered with mask nitride film 158.

Figure 6B:
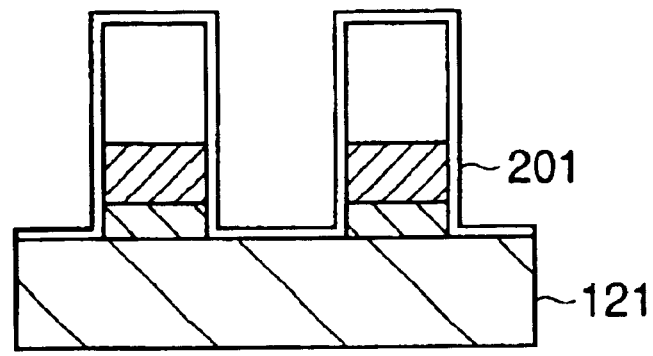

In the vapor phase growth system illustrated in FIG. 4, after the pressure within processing furnace 12 is reduced to a predetermined level in a range of 13.3 to 266 Pa (0.1–2.0 Torr), DCS-Si$_3$N$_4$ is deposited in a thickness of 5–10 nm using DCS and ammonia as reaction gases for forming nitride film 201 under the following processing conditions: at the gas flow ratio DCS/NH$_3$ in a range of 1/10 to 1/20, at temperature of 600° C., and for a deposition time of approximately two hours (FIG. 6B).

Figure 6C:
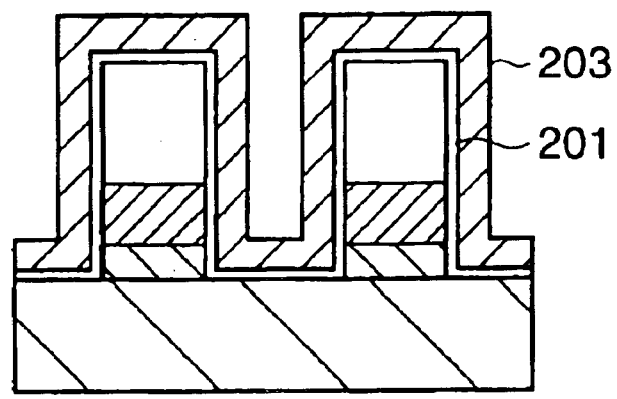

Subsequently, as illustrated in FIG. 6C, HCD-Si$_3$N$_4$ is deposited in a thickness of 40–70 nm using HCD and ammonia as reaction gases for forming nitride film 203, without exposing the semiconductor substrate to external air, under the following processing conditions: at the gas flow ratio HCD/NH$_3$ equal to 1/30, at temperature of 600° C., and for a deposition time of approximately one hour. It should be noted that DCS-Si$_3$N$_4$ and HCD-Si$_3$N$_4$ can be deposited at temperatures in a range of 400 to 700° C.

Figure 6D:
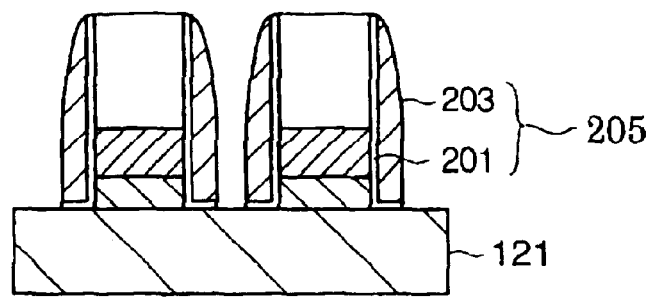

Afterward, nitride film 201 (DCS-Si$_3$N$_4$) and nitride film 203 (HCD-Si$_3$N$_4$) are anisotropically etched to form a spacer nitride film 205 as illustrated in FIG. 6D. Subsequently, after interlayer insulating film 123 is formed by the CVD method, interlayer insulating film 123 is polished by a CMP (Chemical Mechanical Polishing) method to planarize the surface thereof.

Figure 6E:
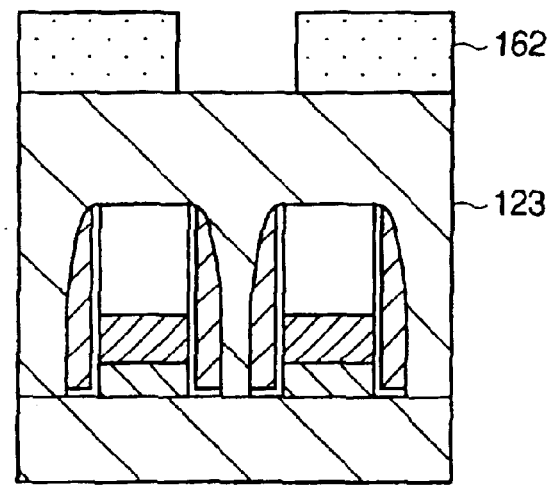
Figure 6F:
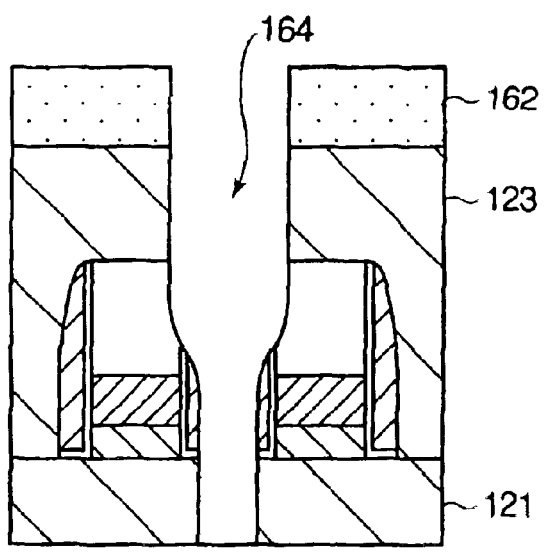

Then, resist mask 162 having an opening for making a plug hole is formed by a known lithographic step, as illustrated in FIG. 6E. Subsequently, interlayer insulating film 121 and interlayer insulating film 123 are anisotropically etched from above resist mask 162 to form plug hole 164, as illustrated in FIG. 6F.

Figure 6G:
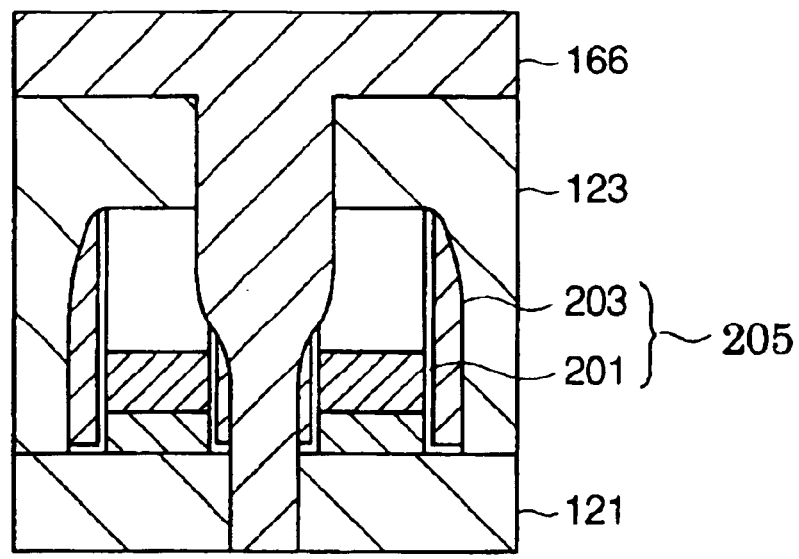
Figure 6H:
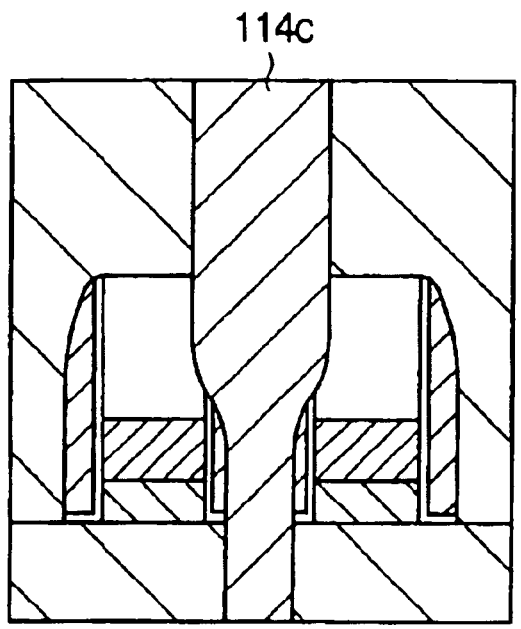

As illustrated in FIG. 6G, after resist mask 162 is removed, plug hole 164 is embedded with impurity diffused polysilicon 166. Then, impurity diffused polysilicon 166 formed on interlayer insulating film 123 is removed by overall etching to form silicon plug 114c (FIG. 6H).

Subsequently, a capacitor is formed on silicon plug 114c in a manner similar to before, and desired wiring is formed with a conductive material to complete a DRAM.

Now, description will be made on the leak current characteristic of a laminate nitride film composed of laminated nitride film 201 and nitride film 203 according to the aforementioned method of manufacturing the semiconductor device.

A leak current of the laminate nitride film was measured to be approximately 2E-6 [A/cm$^2$], when measured in a manner similar to the conventional leak current characteristic evaluating method. This leak current indicates a value smaller by approximately two orders of magnitude, as compared with the leak current exhibited by a single layer of HCD-Si$_3$N$_4$ which is approximately 3E-4 [A/cm$^2$]. This is because DCS-Si$_3$N$_4$, which comprises nitride film 201, has a leak current of approximately 2E-7 [A/cm$^2$] and therefore exhibits good insulating properties.

Next, description will be made on the thickness uniformity of the laminate nitride film.

When nitride film 201 and nitride film 203 were deposited in order in the manufacturing method described above, monitor substrates were mounted on wafer board 26 for measuring the thickness of a deposited film. After deposition of nitride film 203, the thickness of the laminate nitride film was measured on the monitor substrates at a predetermined number of points. Then, average value X and deviation R were calculated for the measured thicknesses, and (R/2X)× 100 [%] was calculated as a dispersion indicative of the film uniformity in the surfaces of the monitor substrates. As a result, the laminate nitride film exhibited the dispersion of approximately 3%, which is one-half that of the single layer of HCD-Si$_3$N$_4$, i.e., approximately 6%.

As described above, the method of manufacturing a semiconductor device according to the present invention creates a laminate structure for an insulating film between conductors by depositing a first nitride film in a lesser thickness (for example, in a thickness of 5 to 10 nm), which excels in the leak current characteristic, for the first layer, and then depositing a second nitride film which can be deposited quickly for the second layer, without exposure to external air. The resulting laminate insulating film can limit a leak current between conductors as compared with the conventional single layer, and is free from adverse influence on the thickness uniformity, and accordingly has an improved film quality.

Also, as described above, when the semiconductor device is a DRAM in which the laminate nitride film is formed between a silicon plug connected to a capacitor and a bit line, a reduced leak current flows from the capacitor into the bit line through the silicon plug. Thus, the resulting DRAM can store charges on the capacitor for a longer time, and can be refreshed at longer time intervals, resulting in a reduction in power consumption of the DRAM.

Also, with the deposition of the first nitride film in a lesser thickness, the throughput can be maintained equivalent to that of the conventional single-layer insulating film. In addition, the deposition of the first and second nitride films at lower temperature of 400–700° C. reduces the amount of heat treatment applied to the semiconductor substrate. This can prevent the diffusion of impurities within the semiconductor substrate and increase the integration degree of the semiconductor device.

Further, since the second nitride film is deposited after the deposition of the first nitride film without exposure to external air, impurity ions such as sodium ions (Na+) floating in external air can be prevented from being trapped between the first and second nitride films, thereby further reducing the leak current.

Spacer nitride film 205 used in the foregoing manufacturing method may be applied to a side wall of a gate electrode in a cell transistor, as described below.

Figure 7:
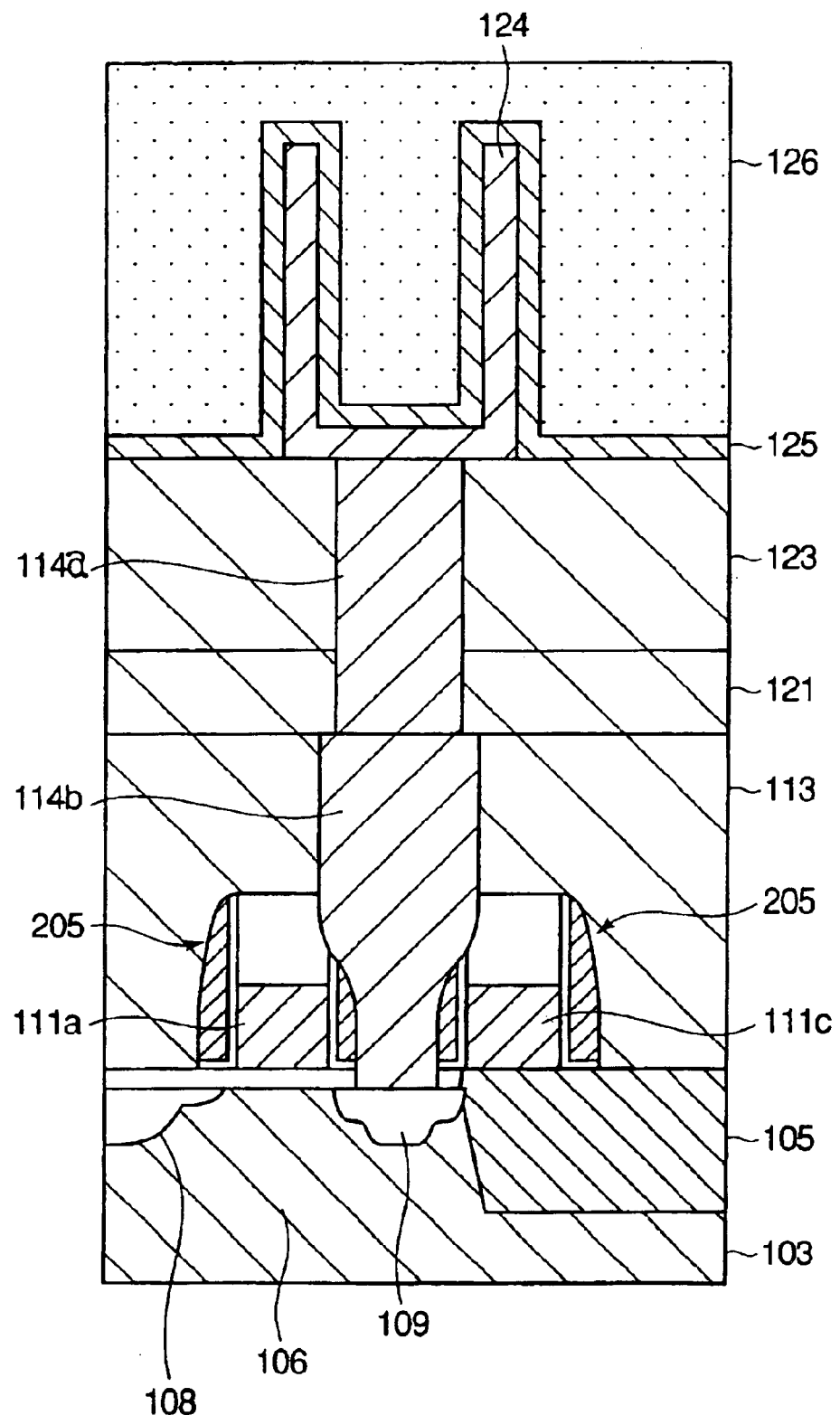
FIG. 7 is a cross-sectional view illustrating the structure of a semiconductor device in which a spacer nitride film created by the manufacturing method of the present invention is applied to an insulating film which covers a side wall of a gate electrode of a cell transistor.

FIG. 7 is a cross-sectional view illustrating a semiconductor device in which the spacer nitride film is applied to an insulating film which covers a side wall of a gate electrode of a cell transistor.

As illustrated in FIG. 7, spacer nitride film 205 covers the side wall of gate electrode 111a of cell transistor 106 and the side wall of gate electrode interconnection 111c. The rest of the structure is similar to that of FIG. 1 in that lower electrode 124 of a capacitor is connected to source electrode 109 of cell transistor 106 through silicon plugs 114a, 111b.

The structure illustrated in FIG. 7 reduces a leak current between gate electrode 11a and gate electrode interconnection 111c and silicon plug 1114b, as compared with a spacer nitride film comprised of a single layer of HCD-Si$_3$N$_4$.

(Second Embodiment)

A manufacturing method according to a second embodiment differs from the first embodiment in that the first nitride film is deposited using HCD and ammonia at a gas flow ratio HCD/NH$_3$ lower than before, and the second nitride film is then deposited at a gas flow ratio HCD/HN$_3$ higher than that set for the first nitride film.

Sine the structure of a semiconductor device manufactured by the manufacturing method of the second embodiment is similar to that of the first embodiment except that nitride film 201 shown in FIG. 5 is made of HCD-Si$_3$N$_4$, detailed description thereon is omitted.

The method of manufacturing the semiconductor device according to the present invention will now be described with reference to FIGS. 6A to 6C.

In a manner similar to the first embodiment, bit lines 117a, 117b are formed on interlayer insulating film 121 (FIG. 6A). Bit lines 117a, 117b have their top surfaces covered with mask nitride film 158.

Then, as illustrated in FIG. 6B, after the pressure within processing furnace 12 is reduced to a predetermined level in a range of 13.3 to 266 Pa (0.1–2.0 Torr) in the vapor phase growth system illustrated in FIG. 4, HCD-$Si_3N_4$ is deposited in a thickness of 5–10 nm using HCD and ammonia as reaction gases for forming nitride film 201 under the following processing conditions: at the gas flow ratio HCD/$NH_3$ equal to 1/100, at temperature of 600° C., and for a deposition time of approximately one hour.

Subsequently, as illustrated in FIG. 6C, HCD-$Si_3N_4$ is deposited in a thickness of 40–70 nm using HCD and ammonia as reaction gases for forming nitride film 203, without exposing the semiconductor substrate to external air, under the following processing conditions: at the gas flow ratio HCD/$NH_3$ equal to 1/30, at temperature of 600° C., and for a deposition time of approximately one hour. The subsequent processing is performed in a manner similar to the first embodiment to complete a DRAM.

Now, description will be made on the leak current characteristic for a single layer of HCD-$Si_3N_4$ when the gas flow ratio $NH_3$/HCD is varied.

The deposition conditions were common except for the gas flow ratio $NH_3$/HCD. Five settings, 30:1, 50:1, 100:1, 120:1, and 150:1 were provided for the gas flow ratio $NH_3$/HCD. The leak current was measured for each gas flow ratio in a manner similar to the conventional leak current characteristic evaluating method.

Figure 8:
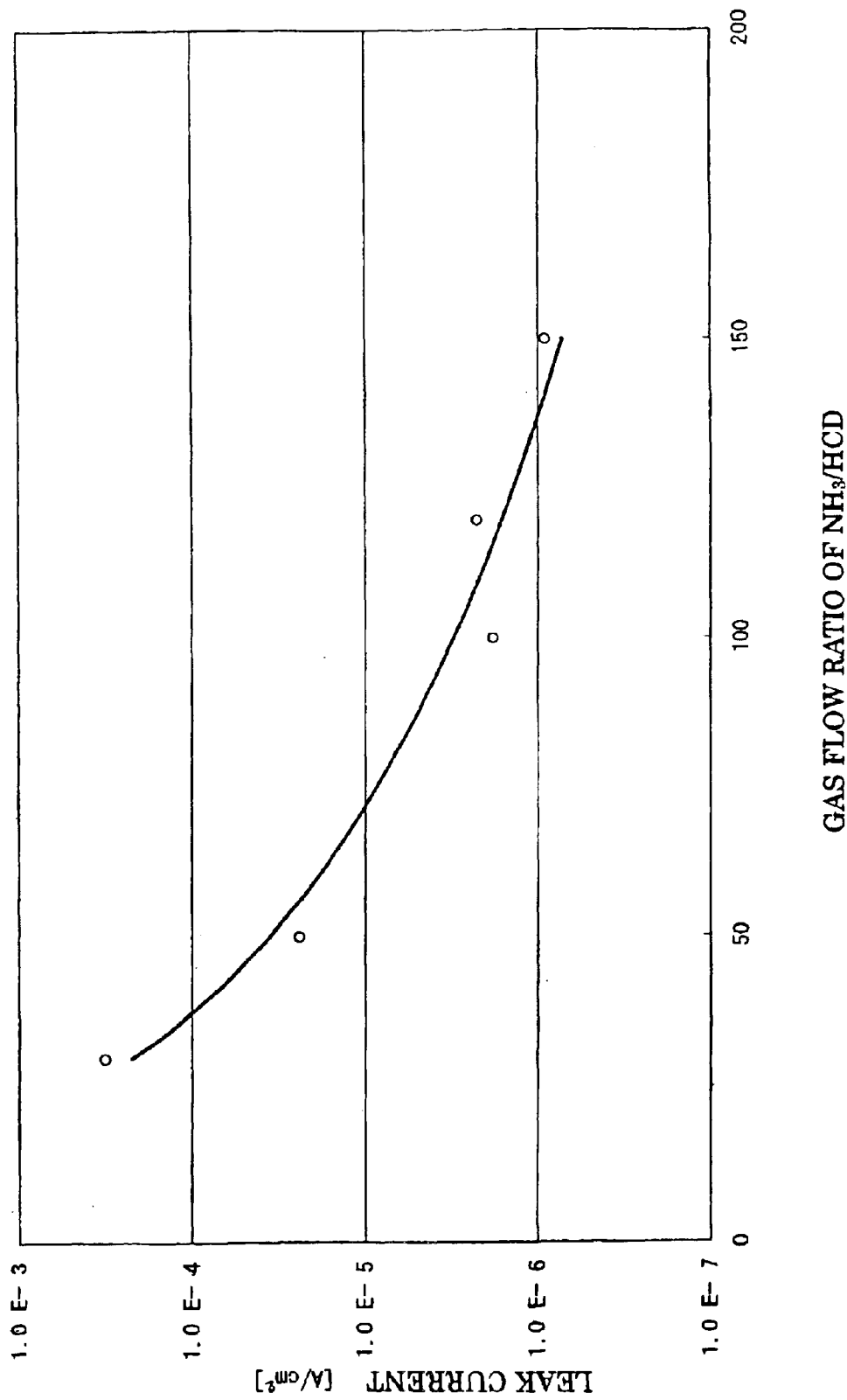
FIG. 8 is a graph showing a gas flow ratio dependence of a leak current.

FIG. 8 is a graph showing the dependence of the leak current on the gas flow ratio $NH_3$/HCD, where the horizontal axis represents the gas flow ratio $NH_3$/HCD, and the vertical axis represents the leak current.

Circles plotted in FIG. 8 indicate leak currents at the respective gas flow ratios. When the gas flow ratio $NH_3$/HCD is equal to 30:1, the resulting leak current is approximately 3E-4 [$A/cm^2$]. As the flow rate of ammonia is increased, the leak current decreases, and when the gas flow ratio $NH_3$/HCD is equal to 150:1, the leak current reaches approximately 1E-6 [$A/cm^2$].

It can be understood from the graph shown in FIG. 8 that the leak current decreases as the gas flow rate of ammonia increases, so that HCD-$Si_3N_4$ is improved in film quality. Also, the gas flow ratio $NH_3$/HCD is more preferably in a range of 100:1 to 150:1 in which the leak current decreases to approximately 2E-6[$A/cm^2$] or less.

In the foregoing manufacturing method, from the fact that nitride film 201 is deposited at the gas flow ratio $NH_3$/HCD equal to 100:1, nitride film 201 has a leak current of approximately 2E-6 [$A/cm^2$] as shown in FIG. 8. It can be understood from this observation that the laminate nitride film composed of laminated nitride film 201 and nitride film 203 will have a leak current smaller than that of a single layer of HCD-$Si_3N_4$ deposited at the gas flow ratio $NH_3$/HCD equal to 30:1.

Next, description will be made on the thickness uniformity of HCD-$Si_3N_4$.

The deposition conditions were common except for the gas flow ratio HCD/$NH_3$. Four settings of HCD/$NH_3$, i.e., 30/900, 20/1000, 10/1000, 10/1500 sccm were provided for the gas flow rates of HCD and $NH_3$. Describing in the gas flow ratio HCD/$NH_3$, they are equivalent to 1:30, 1:50, 1:100, and 1:150.

Monitor substrates for measuring a film thickness were mounted at five locations on wafer board 26 illustrated in FIG. 4. The five locations included a top position (Top), a bottom position (Bottom), a center position (Center) bisecting the spacing between Top and Bottom, a position (TC) bisecting the spacing between Top and Center, and a position (CB) bisecting the spacing between Center and Bottom. The monitor substrates were mounted at five locations on wafer board 36 because not only the film thickness would be examined within the surface of each monitor substrate, but the position dependence would also be examined on wafer board 26. The variation indicative of the thickness uniformity was calculated in a similar manner to the first embodiment.

Figure 9:
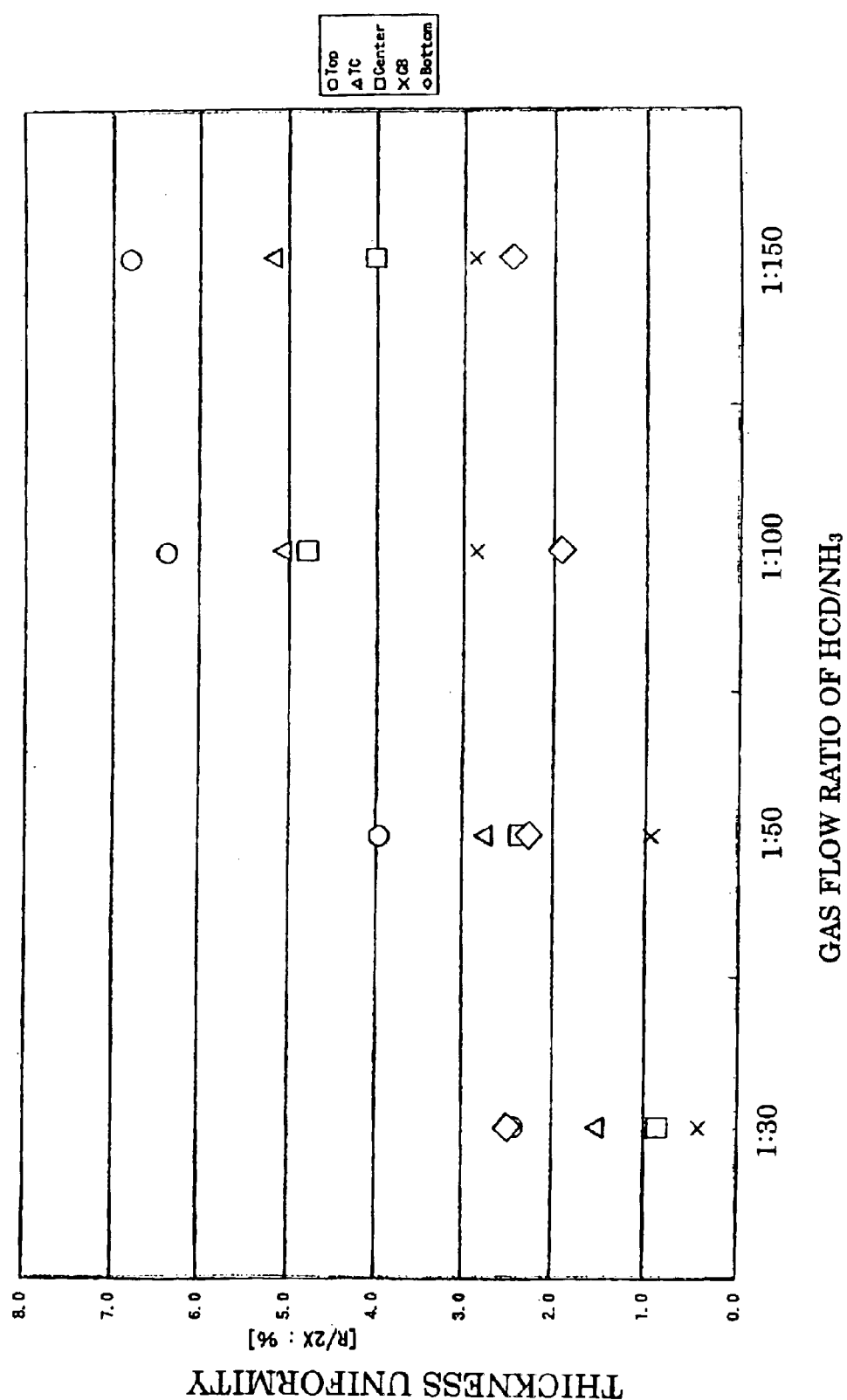
FIG. 9 is a graph showing a gas flow ratio dependence of film uniformity.

FIG. 9 is a graph showing the gas flow ratio dependence of the thickness uniformity, where the horizontal axis represents the gas flow ratio HCD/$NH_3$, and the vertical axis represents the variation indicative of the thickness uniformity. The values of the variations were plotted with circles indicative of variations at position Top at which the monitor substrate was mounted; triangles indicative of variations at TC, squares indicative of variations at Center; crosses indicative of variations at CB; and rhombuses indicative of variations at Bottom.

As can be seen in FIG. 9, when the gas flow ratio HCD/$NH_3$ is set at 1:30, the film thicknesses on the monitor substrates vary in a range of 0.3 to 2.5%, with the difference between the largest and smallest variations being 2.2%. As the gas flow ratio HCD/$NH_3$ is changed one by one and set to 1:150, the film thicknesses on the monitor substrates vary in a range of 2.5 to 6.8%, with the difference between the largest and smallest variations reaching 4.3%. Thus, a smaller gas flow ratio HCD/$NH_3$ results in larger variations in thickness within each monitor substrate and larger variations in thickness among the monitor substrates.

It can be seen from the graph shown in FIG. 9 that a larger gas flow ratio HCD/$NH_3$ results in smaller variations within the surface of a substrate and among substrates and therefore a higher thickness uniformity.

In the foregoing manufacturing method, since nitride film 201 is deposited at the gas flow ratio HCD/$NH_3$ equal to 1:100, the thickness of nitride film 201 largely varies in a range of 2.0 to 6.3%. However, since nitride film 203 is deposited at the gas flow ratio HCD/$HN_3$ equal to 1:30, variations in the thickness are reduced to near 0.3–2.5%. This is because nitride film 203 absorbs the variations in thickness of nitride film 201 to average the variations in thickness of both films since nitride film 203 has a thickness in a range of 40–70, which is much larger than the thickness of nitride film 201 in a range of 5 to 10 nm.

In the second embodiment, after depositing a first nitride film, which excels in the leak current characteristic, in a lesser thickness (for example, in a range of 5 to 10 nm) for the first layer using HCD for a reaction gas, a second nitride film, which varies little in thickness, is deposited for the second layer, without exposure to external air, to make a laminate structure. The resulting insulating film in the laminate structure experiences a smaller leak current between conductors than before, and has variations in thickness substantially equivalent to before. In conclusion, the second embodiment provides a more uniform film quality by depositing the first and second nitride films using HCD for a reaction gas, in addition to similar advantages to the first embodiment.

When a compound of silicon and chlorine is designated by $Si_xCl_y$, hexachlorodisilane with (x, y)=(2, 6) has been used in the first and second embodiments. However, (x, y) may be other than (2, 6).

After nitride film 201 has been deposited, the gases within processing furnace 12 may be once exhausted by exhaust pump 20 before nitride film 203 is deposited. Alternatively, a nitrogen gas cylinder may be previously connected to gas pipe 16 for supplying a nitrogen gas for purging processing furnace 12 of the vapor phase growth system illustrated in FIG. 4, in which case after nitrogen film 201 has been deposited, processing furnace 12 may be purged with a nitrogen gas before nitride film 203 is deposited. Further, the purging of processing furnace 12 with a nitrogen gas may be combined with the exhausting of the gases from processing furnace 12. When the gases within processing furnace 12 are exhausted or processing furnace 12 is purged with a nitrogen gas after nitride film 201 has been deposited, the interface condition can be ameliorated between nitrogen film 201 and nitrogen film 203.

Also, while an ammonia gas is used for the formation of the nitride films in the foregoing embodiments, any other gas may be used as long as it contains nitrogen.

Further, the spacer nitride film according to the second embodiment may be applied to the insulating film for covering the side wall of the gate electrode illustrated in FIG. 7.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device having at least two layers of silicon nitride films, said method comprising the steps of:
   reacting a nitrogen containing gas with dichlorosilane to form one silicon nitride film of said at least two layers of silicon nitride films; and
   reacting the nitrogen containing gas with a compound composed of silicon and chlorine to form another silicon nitride film of said at least two layers of silicon nitride films.

2. A method of manufacturing a semiconductor device having at least two layers of silicon nitride films, said method comprising the steps of:
   reacting a compound composed of silicon and chlorine with a nitrogen containing gas under a condition that a gas flow ratio of said compound to said nitrogen containing gas is smaller than 1/30 to form one silicon nitride film of said at least two layers of silicon nitride films; and
   reacting said nitrogen containing gas with said compound under a condition that said gas flow ratio is higher than during the formation of said one silicon nitride film to form another silicon nitride film of said at least two layers of silicon nitride films.

3. The method of manufacturing a semiconductor device according to claim 2, wherein said gas flow ratio is in a range of 1/100 to 1/150.

4. The method of manufacturing a semiconductor device according to claim 1, wherein said one silicon nitride film is deposited at temperatures in a range of 400 to 700° C.

5. The method of manufacturing a semiconductor device according to claim 1, wherein said another silicon nitride film is deposited at temperatures in a range of 400 to 700° C.

6. The method of manufacturing a semiconductor device according to claim 2, wherein said one silicon nitride film is deposited at temperatures in a range of 400 to 700° C.

7. The method of manufacturing a semiconductor device according to claim 2, wherein said another silicon nitride film is deposited at temperatures in a range of 400 to 700° C.

8. The method of manufacturing a semiconductor device according to claim 1, wherein said compound is hexachlorodisilane.

9. The method of manufacturing a semiconductor device according to claim 2, wherein said compound is hexachlorodisilane.

10. The method of manufacturing a semiconductor device according to claim 1, wherein said nitrogen containing gas is ammonia.

11. The method of manufacturing a semiconductor device according to claim 2, wherein said nitrogen containing gas is ammonia.

12. The method of manufacturing a semiconductor device according to claim 1, wherein said one silicon nitride film has a thickness lesser than that of said another silicon nitride film.

13. The method of manufacturing a semiconductor device according to claim 2, wherein said one silicon nitride film has a thickness lesser than that of said another silicon nitride film.

14. The method of manufacturing a semiconductor device according to claim 1, wherein said one silicon nitride film has a thickness in a range of 5 to 10 nm.

15. The method of manufacturing a semiconductor device according to claim 2, wherein said one silicon nitride film has a thickness in a range of 5 to 10 nm.

16. The method of manufacturing a semiconductor device according to claim 1, wherein said another silicon nitride film has a thickness in a range of 40 to 70 nm.

17. The method of manufacturing a semiconductor device according to claim 2, wherein said another silicon nitride film has a thickness in a range of 40 to 70 nm.

* * * * *